United States Patent [19]
Debroux

[11] Patent Number: 5,530,404
[45] Date of Patent: Jun. 25, 1996

[54] VARIABLE GAIN AMPLIFIER HAVING N PARALLEL-CONNECTED ELEMENTARY AMPLIFIERS

[75] Inventor: Jean-Francois Debroux, Saint-Etienne-de-Saint-George, France

[73] Assignee: Thomson-CSF Semiconducteurs Specifiques, Paris, France

[21] Appl. No.: 351,751

[22] Filed: Dec. 8, 1994

[30] Foreign Application Priority Data

Dec. 17, 1993 [FR] France ................... 93 15228

[51] Int. Cl.$^6$ ............................................ H03G 3/10
[52] U.S. Cl. ............................ 330/278; 230/295
[58] Field of Search ................... 330/51, 254, 278, 330/284, 295

[56] References Cited

U.S. PATENT DOCUMENTS 4,462,003  7/1984  Takanatsu ................ 330/295 X

FOREIGN PATENT DOCUMENTS 2228324  4/1974  France .
1487527  8/1969  Germany .
3813532  11/1989  Germany .

Primary Examiner—Steven Mottola
Attorney, Agent, or Firm—Roland Plottel

[57] ABSTRACT

A variable gain amplifier which has n parallel-connected elementary amplifiers, and components for selecting j-order (j=1, 2, ..., n) elementary amplifier according to the desired gain. Each elementary amplifier is of a common base type. The variable gain amplifier includes components that are used to obtain a low value input impedance that is independent of the gain of the selected elementary amplifier. The variable gain amplifier will find particular application at the input stages of amplification lines of receiving circuits which require noise performance characteristics.

6 Claims, 3 Drawing Sheets

VARIABLE GAIN AMPLIFIER HAVING N PARALLEL-CONNECTED ELEMENTARY AMPLIFIERS

BACKGROUND OF THE INVENTION

1. Field of the Invention

The invention relates to a variable gain amplifier and more particularly to an input stage of an amplification line of a reception circuit, which for example is of a type used in transmission systems.

The amplification lines of reception circuits require a set of characteristics that are difficult to reconcile with one another: -- the gain, which is variable, should be high, the input impedance should have a low value and should be independent of the gain, the noise factor should be low, and the compression point should be high.

2. Description of the Prior Art

In the prior art, there are known ways of making the input stages of such amplification lines by the parallel connection of several amplifiers of the common emitter type that are switched according to the gain desired. It is then necessary to add a low-value resistor in parallel at the input of the circuit so that the input impedance has a low value and is independent of the gain.

The performance characteristics in terms of noise are then much lowered.

The invention does not have this drawback.

SUMMARY OF THE INVENTION

An object of the present invention is a variable gain amplifier formed by n parallel-connected elementary amplifiers and comprising means enabling the selection of the j-order (j=1, 2, ..., n) elementary amplifier according to the gain desired, wherein said variable gain amplifier comprises means that can be used to obtain a low-value input impedance that is independent of the gain of the selected amplifier while at the same time keeping excellent noise performance characteristics. According to an aspect of the invention, the j-order elementary amplifier is of the common base type.

BRIEF DESCRIPTION OF THE DRAWINGS

Other features and advantages of the invention shall appear from the following preferred embodiment made with reference to the appended figures, of which.

In all the figures, the same references are used to designate the same elements.

MORE DETAILED DESCRIPTION

Figure 1:
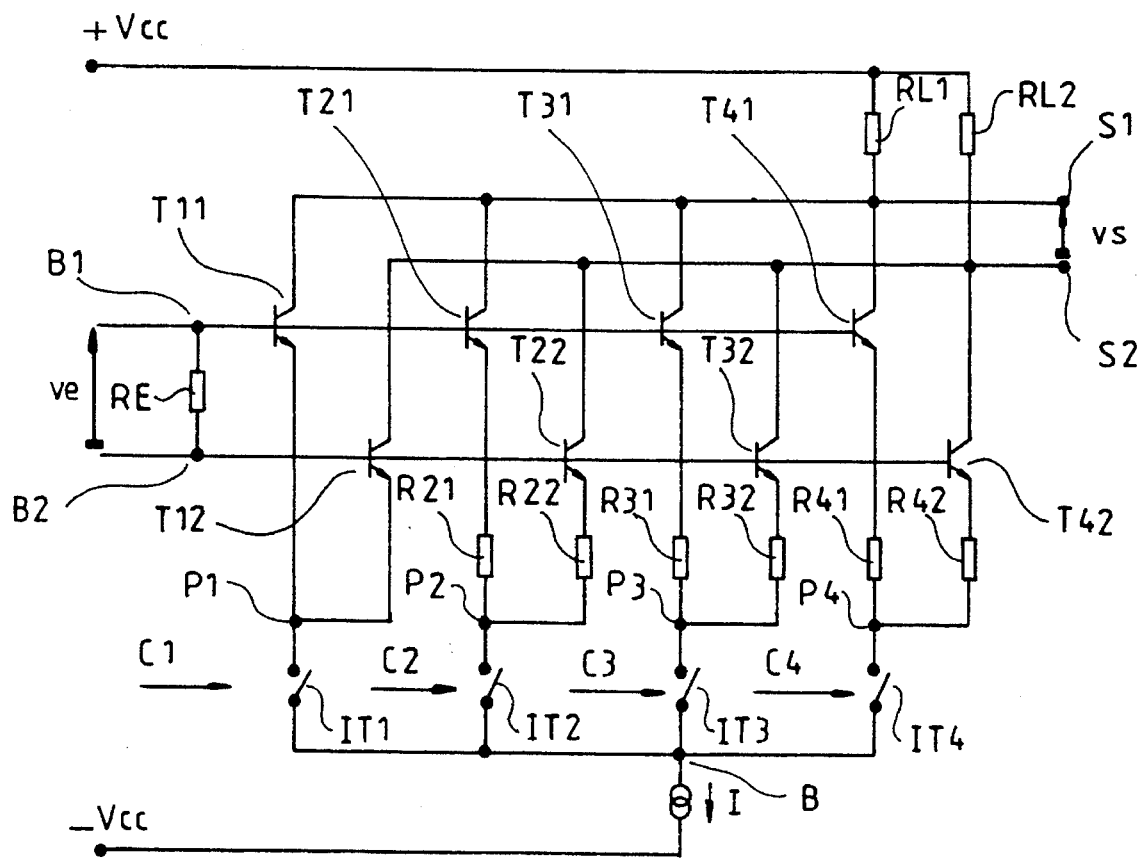
FIG. 1 shows an input stage of a prior art amplification line.

The circuit of FIG. 1 shows an exemplary embodiment of an input stage of a prior art amplification line.

This circuit is constituted, for example, by four parallel-connected amplifiers of the common emitter type. Each amplifier is formed by two transistors Ti1 and Ti2 (i=1, 2, 3, 4). The four transistors T11, T21, T31 and T41 have their bases connected to the same point B1 and their collectors connected to the same point C1. The four transistors T12, T22, T32 and T42 have their bases connected to the same point B2 and their collectors connected to the same point S2.

The resistors RL1 and RL2 connect the supply voltage +Vcc to the respective points S1 and S2. The emitter of each transistor Ti1 is charged by a resistor Ri1. Similarly, the emitter of each transistor Ti2 is charged by a resistor Ri2. As is known to those skilled in the art, these emitter resistors produce the transfer characteristics of the amplifier to be linearized.

As can be seen in FIG. 1, the values of the resistors R11 and R12 are equal to zero. The resistors Ri1 and Ri2 are connected to one and the same point Pi and each point Pi is connected to the same point B by means of a switch ITi. A current generator I connects the supply voltage −Vcc to the point B.

Each switch ITi is controlled by a command Ci. Depending on whether the switch ITi is closed or open, the amplifier-formed by the two transistors Ti1 and Ti2 is respectively activated or deactivated.

The input voltage ve is tapped between the points B1 and B2 and the output voltage vs between the points S1 and S2. As mentioned above, a resistor RE is placed between the points B1 and B2 so that the input impedance is low and independent of the gain.

Figure 2:
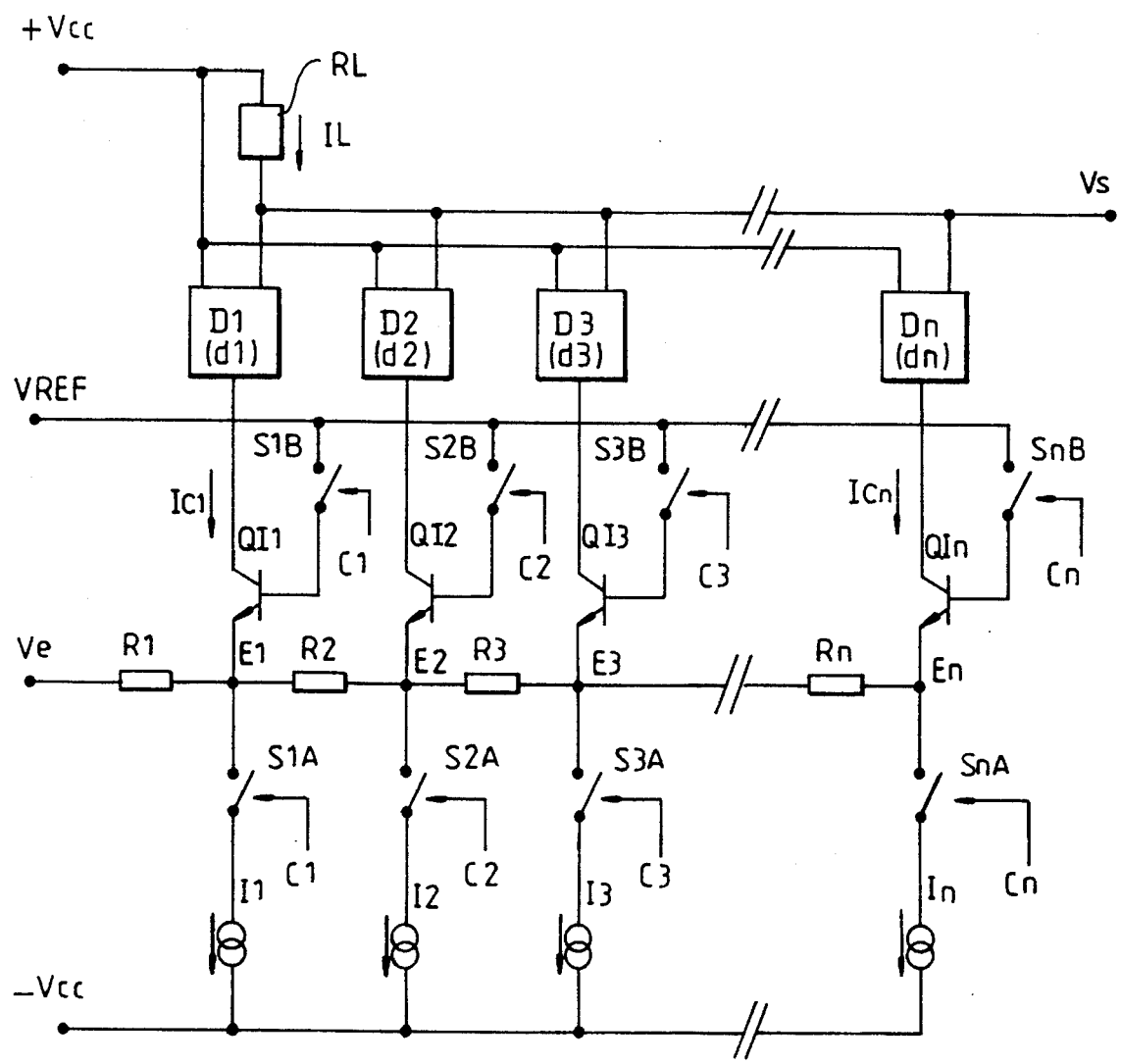
FIG. 2 shows a schematic diagram of an input stage of an amplification line according to the invention.

FIG. 2 is a schematic drawing of an input stage of an amplification line according the invention.

The circuit of FIG. 2 is formed by n parallel-connected elementary amplifiers of the common base type. As specified further below, there are means enabling the selection of a j-order amplifier where j has any value so as to obtain the desired gain. The transistors shown in FIG. 2 are NPN type transistors, and which require a. However, the invention also relates to circuits whose transistors are PNP type transistors. change of polarity of the supplies.

The j-order amplifier comprises chiefly a transistor Q1j and a current divider Dj. When the j-order amplifier is selected, the transistor Q1j has its base connected to a DC voltage VREF adjusted so that the transistor works in a linear zone, and has its emitter Ej connected to a DC bias voltage −Vcc by for a current generator Ij. The current divider Dj for is connected to the transistor Q1j so that only a fraction dj of the current that goes through the transistor Q1j goes through the load resistor RL connected to the supply voltage +Vcc, the output voltage vs of the amplification stage is tapped at the terminals of this load resistor.

Elements to make the selection of the j-order amplifier include a switch SjB connecting the base of the transistor Q1j to the DC voltage VREF and a switch SjA connecting the emitter Ej of the transistor Q1j to the current generator lj. Preferably, the switches SjA and SjB are controlled by one and the same command Cj.

The emitters E1, E2, ..., En of the respective transistors Q11, Q12, ..., Q1n are connected to one another by a set of series-connected resistors.

Thus, the resistor Rj connects the emitter Ej−1 to the emitter Ej. The emitter E1 is connected, not only to the emitter E2 by the resistor R2 but also to the variable input voltage ve by means of a resistor R1.

When the j-order amplifier is selected, the input impedance of the amplification stage is equal to:

$$Zej = R1 + R2 + \ldots + Rj + Ut/Ij$$

where Ut is the thermodynamic potential (Ut=kT/q, k being the Boltzman constant, T the temperature of the device in terms of absolute degrees and q the charge of the electron).

The values of the resistors R1, R2, ..., Rn and the values of the currents 11, 12, ..., in are then chosen so that the input impedance of the amplification stage has the same value whatever the amplifier selected.

Thus, when the order j rises, the DC current lj increases so as to reduce the influence of the term Ut/lj. The resistor R1+R2+ ... +Rj then compensates for the quantity Ut/lj so that the input impedance Zej remains constant.

According to a preferred embodiment, the resistor R1 is taken to be equal to zero in such a way that the first-order amplifier has good noise performance characteristics.

As mentioned above, the current dividers make it possible for only one fraction dj of the current that goes through the transistor Qlj to go through the load resistor RL at whose terminals the output voltage vs of the amplification stage is tapped.

Thus, each current divider Dj is formed so that the current IL going through the load RL is a fraction dj of the current lcj that goes through the transistor Qlj. It is then possible to write:

$$IL=dj \times lcj$$

The gain in voltage of the j-order amplifier is then Avj such that:

$$Avj=dj \times RL/Zej$$

In general, the current divider Dj of the j-order amplifier comprises any number of transistors and the fractions of current dj are adjusted so as to ensure the desired values Avj. Preferably, the gain Avj decreases when the order j rises. Advantageously, the series defined by the fractions d1, d2, ..., dn may then be a series with geometrical progression, for example at a rate of ½.

We then get:

$$d1 = 1; d2 = \frac{1}{2}; \ldots; dn = \frac{1}{2^{n-1}}$$

The j-order divider is then constituted by $2^{(j-1)}$ transistors (not shown in the figure) whose emitters are connected to one another and to the collector of the transistor Qlj. Among these $2^{(j-1)}$ transistors, $2^{(j-1)}-1$ have their collectors connected to one another and to the same DC bias voltage +Vcc and the $2^{(j-1)}$th transistor has its collector connected to a point at which the output voltage vs of the amplification stage is tapped, this point being itself connected, via the load resistor RL, to the DC bias voltage +Vcc.

The bases of the $2^{(j-1)}$ transistors of the j-order divider are connected to one another and to a same bias voltage. Preferably, the bases of all the transistors of all the dividers Dj are connected to the same point.

Advantageously, the first-order amplifier has the best performance characteristics in terms of gain and noise. The variation in gain is provided by the higher than first-order amplifiers which have ever smaller gains.

Preferably, the DC current that goes through the load resistor RL is chosen so as to be independent of the value of the gain of the amplifier. It follows therefrom that the current lj is such that lj=ll/dj.

Figure 3:
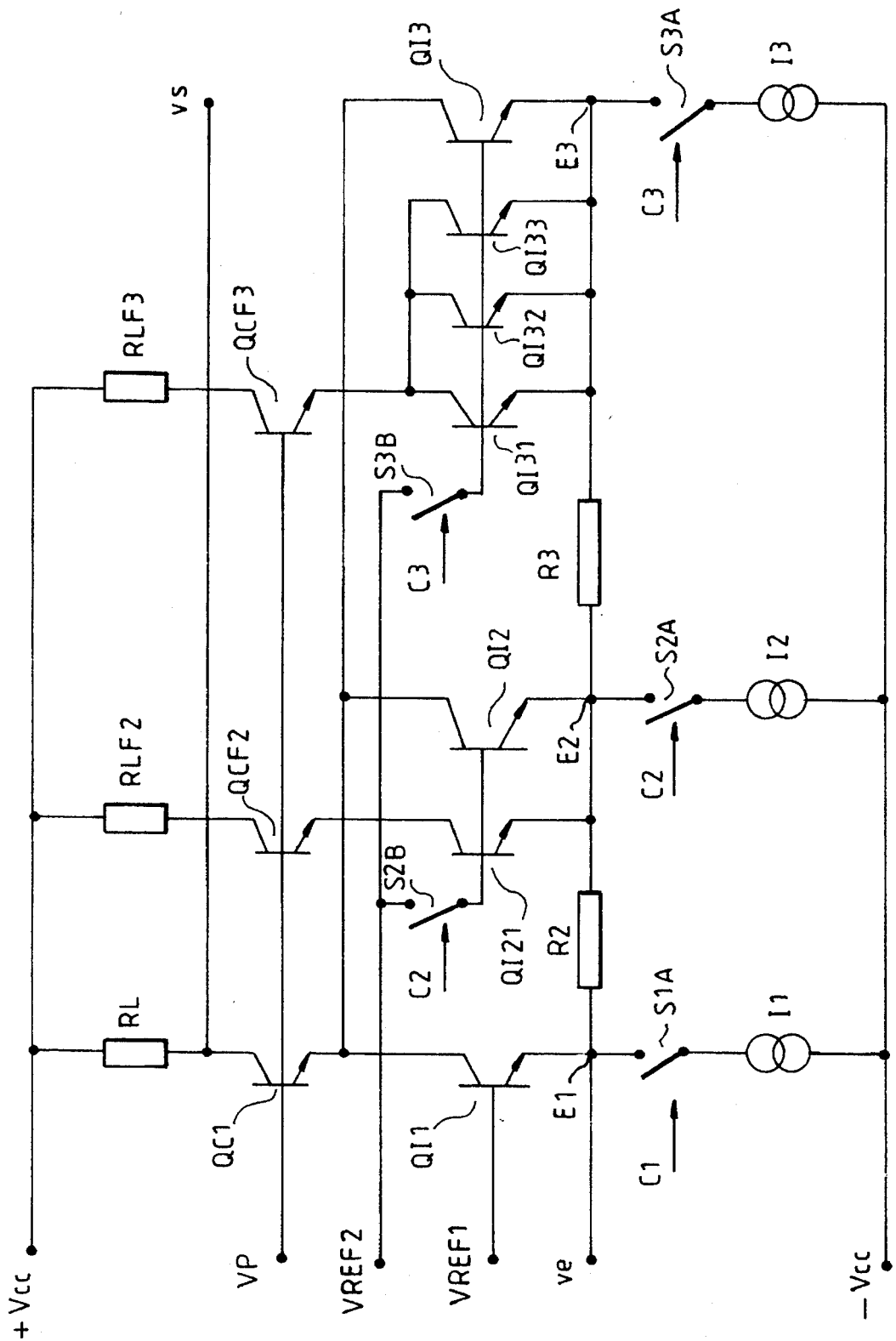
FIG. 3 shows the diagram of an input stage of an amplification line according to the preferred embodiment of the invention.

FIG. 3 is a diagram of an input stage of an amplification line according to a preferred embodiment of the invention.

This diagram shows three parallel-connected amplifiers. Generally, the preferred embodiment relates, however, to any number n of parallel-connected amplifiers.

According to this preferred embodiment of the invention, each transistor Qlj of the j-order amplifier takes part in the current divider Dj. The collector of each transistor Qlj is connected to the load RL by means of one and the same cascode-connected transistor QC1 so as to improve the passband of the amplification stage. The transistor QC1 has its emitter connected to the collectors of the transistors Qlj, its collector connected to the output of the amplification stage and to one of the terminals of the load RL whose other terminal is connected to the supply voltage +Vcc and its base connected to a bias voltage Vp adjusted so that the transistor QC1 works in a linear zone.

According to the preferred embodiment, the current divider Dj includes $2^{(j-1)}$ transistors. Thus, apart from the transistor Qlj, the current divider of the j-order amplifier preferably comprises $2^{(j-1)}-1$ transistors Qljk, (k=1, 2, $2^{(j-1)}-1$). The transistors Qljk of the same order j have their collectors connected to one another and to the emitter of a cascode type transistor QCFj whose base is connected to the bias voltage VP and whose collector is connected to the bias voltage +Vcc by means of a resistor RLFj.

The transistors QCFj enable the balancing of the currents between the division transistors by balancing the base-collector voltages of these transistors. Each resistor RLFj enables the improving of the precision with which the base-emitter voltage of the transistor QCFj is defined.

All the transistors that constitute one and the same j-order divider have their bases connected to one another and their emitters connected to one another.

The emitters E1, E2, ..., En of the respective transistors Q11, Q12, ..., Q1n are connected to one another by a set of series-connected resistors. It follows therefrom that the emitters of the transistors of the j-order divider are connected to the emitters of the transistors of the j−1 order divider by a resistor Rj. The emitter E1 is connected to the input voltage ve. Just as in the basic circuit of FIG. 2, a switch SjA connects the emitter Ej of the transistor Qlj to one of the two terminals of a DC current generator lj whose other terminal is connected to the bias voltage −Vcc.

According to a preferred embodiment, the base of the transistor Q11 of the first-order amplifier is connected directly to a first reference voltage VREF1 while the bases of the higher than first order transistors Qljk of the same order are connected to a second reference voltage VREF2 by means of a switch SjB. The voltages VREF1 and VREF2 are chosen so that the first-order amplifier is off when any of the j-order amplifiers where j is greater than 1 is activated. Thus, for an embodiment of the circuit with NPN type transistors, the voltage VREF2 is greater than the voltage VREF1 and adjusted accordingly. Owing to the absence of a switch on the base of the transistor Q11, the noise performance characteristics of the first-order amplifier designed to amplify the low amplitude signals are then advantageously improved as compared with the performance characteristics of the higher than first order amplifiers designed to amplify signals that are less sensitive to the noise level.

When the j-order amplifier is selected, the transistor Qlj is on as are the $2^{(j-1)}-1$ transistors Qljk. Similarly, in the circuit described in FIG. 2, the resistor RL is crossed only by a fraction dj of the current lj. The input impedance Zej and the gain Avj of the j-order transistor can be expressed as follows:

$$Zej=R2+R3+ \ldots +Rj+Ut/lj$$

$$Avj=dj \times RL/Zej$$

As above, the resistors R2, R3, ..., Rj and the currents 11, 12, ..., lj are chosen so that the input impedance of the amplification stage is the same whatever the order in which the amplifier is positioned. According to a preferred embodiment, the current lj is chosen so that lj=l1/dj and the series defined by the factions d1, d2, . . . , dn is a series in geometrical progression, for example at a rate of ½. As above, we then get:

$$d1 = 1; d2 = 1/2; \ldots ; dn = \frac{1}{2^{n-1}}$$

The value assumed by the resistor RLFj is then:

$$RLFj=RL/(2^{(j-1)}-1)$$

If the dynamic range of the gain of the amplification stage is high, it follows therefrom that dj must take very low values. The division of the current can then be done in two steps and no longer directly by the $2^{(j-1)}$ transistors. The first step may be performed by the parallel connection of the cascode type transistors with the transistor QCFj and the second by the parallel connection of transistors Qljk fewer in number than in the previous case. The invention also relates to this type of configuration.

The circuits described above are referenced-mode circuits having only one input and one output. More generally, the invention relates to differential mode circuits using the referenced-mode circuits according to the invention. Such circuits are then differential amplifiers comprising two inputs and two outputs.

What is claimed is:

1. A variable gain amplifier formed by n parallel-connected elementary amplifiers and comprising means (SjA, SjB) enabling the selection of an elementary amplifier of any j order (j=1, 2, . . . , n) according to the gain desired, wherein each elementary j-order amplifier is of the common base type and wherein said variable gain amplifier comprises means so that the input impedance of each selected amplifier has the same value whatever the amplifier selected, and wherein each elementary j-order amplifier has a transistor Qlj which, when said amplifier is selected, has its base connected to a DC voltage VREF adjusted so that said transistor works in a linear zone and its emitter connected to a first DC bias voltage (−Vcc) by means of a current generator lj, the emitter of the j+1 order transistor being connected to the emitter of the j order transistor by a resistor Rj, the emitter E1 of the transistor Ql1 being connected not only to the emitter E2 of the transistor Ql2 by the resistor R2 but also to the variable input voltage (ve), the values of the currents lj and of the resistors Rj being chosen so that the input impedance of the amplifier has the same value irrespectively of the order j of the elementary amplifier and a current divider (Dj) connected to said transistors Qlj so that only a fraction dj of the current that goes through the transistor Qlj goes through a load resistor (RL) at the terminals of which the output voltage (vs) of the amplifier is tapped.

2. An amplifier according to claim 1, wherein the j-order current divider (Dj) is constituted by $2^{(j-1)}$ transistors whose emitters are connected to one another and to the collector of the transistor Qlj, $2^{(j-1)}-1$ transistors having their collectors connected to one another and to a second DC bias voltage (+Vcc), the $2^{(j-1)}$th transistor having its collector connected to the point at which the output voltage (vs) of said stage is tapped, this point itself being connected, by means of the load resistor (RL) to the second DC bias voltage (+Vcc).

3. An amplifier according to any of the claims 1 or 2, wherein the means (SjA, SjB) enabling the selection of an elementary j-order amplifier are a switch (SjA) connecting the base of the transistor Qlj to the DC voltage VREF and a switch (SjA) connecting the emitter (Ej) of the transistor Qlj to the j-order current (lj) generator.

4. An amplifier according to claim 1, wherein each elementary j-order amplifier has a transistor Qlj which, when said amplifier is selected, has its base connected to a DC voltage (VREF1, VREF2) adjusted so that said transistor works in a linear zone, its emitter connected to a first DC bias voltage (−Vcc) by means of a current generator, the emitter of the j+1 order transistor being connected to the emitter of the j-order transistor by a resistor Rj, the emitter E1 of the transistor Ql1 being connected not only to the emitter E2 of the transistor Ql2 by the resistor R2 but also to the variable input voltage (ve), the values of the currents lj and of the resistors Rj being chosen so that the input impedance of the amplifier has the same value irrespectively of the order j of the amplifier, and its collector connected to the emitter of a cascode type transistor QC1 whose base is connected to a DC voltage VP adjusted so that the transistors QC1 works in a linear zone, and whose collector is connected to a second DC bias voltage (+Vcc) by means of a load resistor (RL) at whose terminals the output voltage (vs) is tapped and wherein each j-order amplifier where j is greater than 1 comprises at least one transistor Qljk whose emitter is connected to the emitter of the transistor Qlj, whose base is connected to a DC voltage (VREF2) adjusted so that the transistors Qljk works in a linear zone when the j-order amplifier is selected and whose collector is connected to the emitter of a cascode type transistor (QCFi) whose base is connected to said voltage VP and whose collector is connected to the second DC bias voltage (+Vcc) through a resistor RLFj.

5. An amplifier according to claim 4, wherein the elementary j-order amplifier comprises $2^{j-1}-1$ transistors Qljk(k=1, 2, . . . , $2^{j-1}-1$).

6. An amplifier according to either of the claims 4 or 5, wherein the means (SjA, SjB) enabling the selection of the elementary first-order amplifier are constituted by a switch (SlA) connecting the emitter of the transistor Ql1 to the first-order current generator (l1) and wherein the means enabling the selection of the elementary j-order amplifier, with j greater than 1, are constituted by a switch (SjB) connecting the base of the transistors Qlj and Qljk to the DC voltage VREF2 and a switch (SjA) connecting the emitter of the transistor Qlj to the j-order current generator (lj).

* * * * *